United States Patent
Huang et al.

(10) Patent No.: US 11,269,377 B2
(45) Date of Patent: Mar. 8, 2022

(54) FLEXIBLE DISPLAY PANEL, METHOD FOR MANUFACTURING THE SAME, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Peng Huang, Beijing (CN); Zhifeng Zhan, Beijing (CN); Hai Zheng, Beijing (CN); Fushi Jin, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 116 days.

(21) Appl. No.: 16/478,756

(22) PCT Filed: Oct. 29, 2018

(86) PCT No.: PCT/CN2018/112366
§ 371 (c)(1),
(2) Date: Jul. 17, 2019

(87) PCT Pub. No.: WO2019/148909
PCT Pub. Date: Aug. 8, 2019

(65) Prior Publication Data
US 2020/0341516 A1      Oct. 29, 2020

(30) Foreign Application Priority Data
Feb. 2, 2018   (CN) .................... 201810105924.6

(51) Int. Cl.
*H05K 1/02*   (2006.01)
*G09F 9/30*   (2006.01)
(Continued)

(52) U.S. Cl.
CPC ............ *G06F 1/1652* (2013.01); *G06F 1/181* (2013.01); *G06F 1/189* (2013.01); *G09F 9/301* (2013.01);
(Continued)

(58) Field of Classification Search
CPC ........ G06F 1/1652; G06F 1/181; G06F 1/189; G06F 9/301; H05K 1/028; H01L 51/0097
See application file for complete search history.

(56) References Cited

U.S. PATENT DOCUMENTS

| | | | |
|---|---|---|---|
| 2008/0157235 A1* | 7/2008 | Rogers ................. | H05K 1/0283 257/415 |
| 2014/0097408 A1* | 4/2014 | Kim .................... | H01L 27/3276 257/40 |
| 2014/0217373 A1 | 8/2014 | Youn et al. | |
| 2014/0232956 A1* | 8/2014 | Kwon ................. | H01L 27/3276 349/12 |
| 2015/0144921 A1 | 5/2015 | Lim et al. | |

(Continued)

FOREIGN PATENT DOCUMENTS

| | | | |
|---|---|---|---|
| CN | 104659062 A | 5/2015 | |
| CN | 104934438 A | 9/2015 | |

(Continued)

OTHER PUBLICATIONS

First Office Action and English language translation, CN Application No. 201810105924.6, dated Mar. 18, 2019, 14 pp.

*Primary Examiner* — Hoa C Nguyen
(74) *Attorney, Agent, or Firm* — Myers Bigel, P.A.

(57) ABSTRACT

The present disclosure relates to the field of flexible display technology and provides a flexible display panel, a method for manufacturing the same, and a display device, which can reduce the stress in the direction perpendicular to the bending surface applied on a portion of the signal lead wire (Continued)

located in the bending area when the flexible display panel is bent. The flexible display panel includes a flexible basal substrate including a first surface, the first surface including a bending area provided with a plurality of protrusions, and a signal lead wire located on a side of the first surface facing away from the flexible basal substrate. The signal lead wire extends across the bending area and has a shape substantially matching the plurality of protrusions.

6 Claims, 6 Drawing Sheets

(51) Int. Cl.
 *G06F 1/16* (2006.01)
 *G06F 1/18* (2006.01)
 *H01L 51/00* (2006.01)
(52) U.S. Cl.
 CPC .......... *H05K 1/028* (2013.01); *H01L 51/0097* (2013.01)

(56) References Cited

U.S. PATENT DOCUMENTS

| | | |
|---|---|---|
| 2016/0035759 A1 | 2/2016 | Kwon et al. |
| 2016/0093644 A1 | 3/2016 | Ki et al. |
| 2016/0218305 A1* | 7/2016 | Kim .................. G02F 1/133345 |
| 2016/0295685 A1 | 10/2016 | Ryu et al. |
| 2017/0237025 A1 | 8/2017 | Choi et al. |
| 2017/0271617 A1* | 9/2017 | Choi .................... H01L 51/0097 |
| 2018/0013079 A1 | 1/2018 | Cai |
| 2018/0182838 A1* | 6/2018 | Yeo ...................... H01L 27/3279 |
| 2020/0281074 A1* | 9/2020 | Okimoto .............. H05K 3/0014 |

FOREIGN PATENT DOCUMENTS

| | | |
|---|---|---|
| CN | 105144270 A | 12/2015 |
| CN | 205376529 U | 7/2016 |
| CN | 106023810 A | 10/2016 |
| CN | 106716642 A | 5/2017 |
| CN | 107086236 A | 8/2017 |
| CN | 108231800 A | 6/2018 |

\* cited by examiner

FLEXIBLE DISPLAY PANEL, METHOD FOR MANUFACTURING THE SAME, AND DISPLAY DEVICE

RELATED APPLICATIONS

The present application is a 35 U.S.C. 371 national stage application of PCT International Application No. PCT/CN2018/112366, filed on Oct. 29, 2018, which claims the benefit of Chinese Patent Application No. 201810105924.6, filed on Feb. 2, 2018, the entire disclosures of which are incorporated herein by reference.

TECHNICAL FIELD

The present disclosure relates to the field of flexible display technology, and particularly to a flexible display panel, a method for manufacturing the same, and a display device.

BACKGROUND

The narrow frame of the display device and even no frame is the mainstream development trend of the current display technology. A flexible display product is fabricated on a flexible, bendable carrier. By bending the side of the flexible display product bonded to the control chip toward the back side of the display surface, a narrow frame design of the pad area can be achieved.

When the pad area is bent toward the back side of the display surface, a bending area appears between the pad area and the display area. Since a plurality of metal lead wires for transmitting signals are disposed between the pad area and the display area, each lead wire must pass through the bending area.

As the degree of bending increases, the portion of the metal lead wire in the bending area is easily broken by the stress perpendicular to the bending surface of the bending area, thereby causing poor signal transmission and affecting normal display of the flexible display product.

SUMMARY

In the first aspect of the present disclosure, a flexible display panel is provided. The flexible display panel includes: a flexible basal substrate including a first surface, the first surface including a bending area provided with a plurality of protrusions; and a signal lead wire located on a side of the first surface facing away from the flexible basal substrate. The signal lead wire extends across the bending area and has a shape substantially matching the plurality of protrusions.

Optionally, the signal lead wire is in direct contact with the bending area of the first surface.

Optionally, the flexible display panel further includes a first insulating layer on the first surface and exposing the bending area. A portion of the signal lead wire outside the bending area is located on a surface of the first insulating layer facing away from the flexible basal substrate.

Optionally, the flexible display panel further includes a second insulating layer in direct contact with the bending area of the first surface. A portion of the signal lead wire in the bending area is located on a surface of the second insulating layer facing away from the flexible basal substrate.

Optionally, the flexible display panel further includes a third insulating layer on the first surface and outside the bending area. A portion of the signal lead wire outside the bending area is located on a surface of the third insulating layer facing away from the flexible basal substrate.

Optionally, in a direction perpendicular to the first surface of the flexible basal substrate, a thickness of the third insulating layer is larger than a thickness of the second insulating layer.

Optionally, the second insulating layer is made of an organic insulating material; in a direction perpendicular to the first surface of the flexible substrate, a height of the plurality of protrusions is in a range of 100 nm to 400 nm, a thickness of the second insulating layer is in a range of 300 nm to 800 nm. Alternatively, the second insulating layer is made of an inorganic insulating material; in a direction perpendicular to the first surface of the flexible substrate, a height of the plurality of protrusions is in a range of 100 nm to 200 nm, a thickness of the second insulating layer is in a range of 100 nm to 300 nm.

Optionally, in a direction perpendicular to the first surface of the flexible substrate, a cross-sectional shape of the protrusions is any one of a triangle, a trapezoid, a column, or an inclined column.

Optionally, the first surface further includes a display area and a pad area; the bending area is located between the display area and the pad area. The flexible display panel further includes: a display structure layer located in the display area and a bonding electrode located in the pad area; the display structure layer includes a signal wire. The signal lead wire is electrically connected to the signal wire and the bonding electrode.

In the second aspect of the present disclosure, a method for manufacturing a flexible display panel is provided. The method includes: providing a flexible basal substrate including a first surface; the first surface including a bending area; patterning the bending area to form a plurality of protrusions; and disposing a signal lead wire on a side of the first surface facing away from the flexible basal substrate; the signal lead wire extending across the bending area and having a shape substantially matching the plurality of protrusions.

Optionally, before patterning the bending area to form the plurality of protrusions, the method further includes: forming a first insulating layer on the first surface exposing the bending area. The step of disposing the signal lead wire on the side of the first surface facing away from the flexible basal substrate includes: disposing the signal lead wire directly on the bending area of the first surface.

Optionally, before patterning the bending area to form the plurality of protrusions, the method further includes: forming a third insulating layer on the first surface and outside the bending area. After patterning the bending area to form the plurality of protrusions, the method further includes: forming a second insulating layer in the bending area and in direct contact with the bending area. The step of disposing the signal lead wire on the side of the first surface facing away from the flexible basal substrate includes: forming a signal lead wire extending across the bending area. A portion of the signal lead wire in the bending area is in direct contact with the second insulating layer, and a portion of the signal lead wire outside the bending area is in direct contact with the third insulating layer.

Optionally, in a direction perpendicular to the first surface of the flexible basal substrate, a thickness of the third insulating layer is larger than a thickness of the second insulating layer.

Optionally, patterning the bending area to form the plurality of protrusions includes: etching the bending area using a mask having a pattern to form the plurality of protrusions in the bending area.

In the third aspect of the present disclosure, a display device including the flexible display panel is provided. The flexible basal substrate is bent in the bending area in a direction away from the signal lead wire.

BRIEF DESCRIPTION OF THE DRAWINGS

In order to more clearly illustrate the technical solutions in embodiments of the disclosure or in the prior art, the appended drawings needed to be used in the description of the embodiments or the prior art will be introduced briefly in the following. Obviously, the drawings in the following description are only some embodiments of the disclosure, and for those of ordinary skills in the art, other drawings may be obtained according to these drawings under the premise of not paying out creative work.

DETAILED DESCRIPTION OF THE DISCLOSURE

Figure 1:
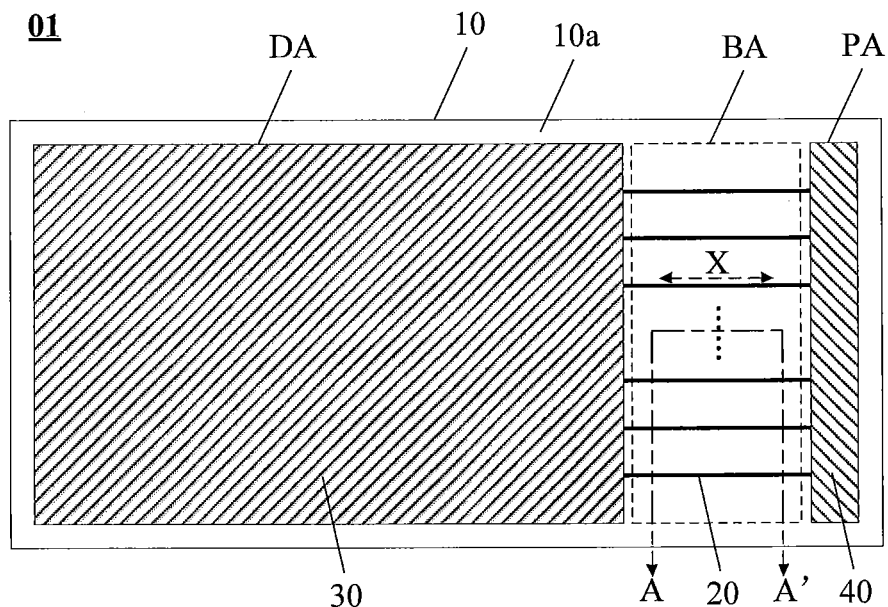
FIG. 1 is schematic top view of a flexible display panel according to an embodiment of the present disclosure.

In the following, the technical solutions in embodiments of the disclosure will be described clearly and completely in connection with the drawings in the embodiments of the disclosure. Obviously, the described embodiments are only part of the embodiments of the disclosure, and not all of the embodiments. Based on the embodiments in the disclosure, all other embodiments obtained by those of ordinary skills in the art under the premise of not paying out creative work pertain to the protection scope of the disclosure.

The terms "first", "second" and similar terms used in the description and the claims are not intended to indicate any order, quantity or importance, and are merely used to distinguish different components. The word "include" or "comprise" or the like means that the element or item preceding the word is intended to cover the elements or objects listed after the word and their equivalents, without excluding other elements or objects. The orientation or positional relationship of the terms "upper", "lower" and the like is based on the orientation or positional relationship shown in the drawings, and is merely for the convenience of describing the present disclosure and does not require that the disclosure must be constructed and operated in a specific orientation, therefore, it should not be construed as limiting the disclosure.

Figure 2:
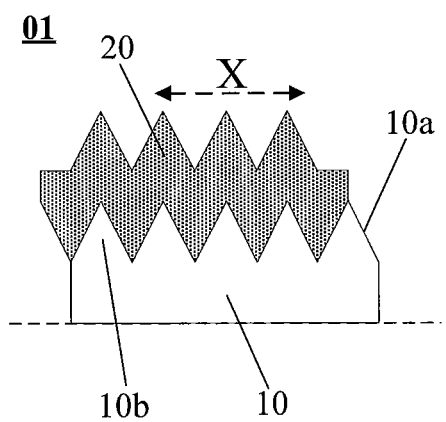
FIG. 2 is a local cross-sectional structural schematic diagram of the flexible display panel of the embodiment shown in FIG. 1 taken along line A-A'.

As shown in FIG. 1 and FIG. 2, a flexible display panel 01 is provided by an embodiment of the present disclosure. The flexible display panel 01 includes: a flexible basal substrate 10 including a first surface 10a, the first surface 10a including a bending area (indicated with BA in the drawings) provided with a plurality of protrusions 10b; and a signal lead wire 20 located on a side of the first surface 10a facing away from the flexible basal substrate 10. The signal lead wire 20 extends across the bending area BA and has a shape substantially matching the plurality of protrusions 10b.

In the context of the present disclosure, "the signal lead wire has a shape substantially matching the plurality of protrusions" means that in an extension direction of the signal lead wire (as indicated by the X direction in FIGS. 1 and 2), the shape of the signal lead wire and the overall shape of the protrusions corresponding to the signal lead wire are substantially the same.

It should be noted that, in FIG. 2, the signal lead wire 20 is only located above the first surface 10a of the flexible basal substrate 10, and the signal lead wire 20 is in direct contact with the first surface 10a in the bending area. The embodiment of the present disclosure does not limit to this, as long as the signal lead wire 20 is located on the side of the first surface 10a facing away from the flexible basal substrate 10.

In addition, the signal lead wire 20 can be made of a conductive material, and can transmit a signal. Specifically, a material such as a metal, an alloy, a metal oxide, or a conductive polymer can be used for the signal lead wire 20, which is not limited in the embodiments of the present disclosure. Hereinafter, the signal lead wire 20 being a metal signal lead wire is taken as an example.

As shown in FIG. 2, the first surface 10a has a plurality of protrusions 10b in the bending area, thus the first surface 10a of the flexible basal substrate is not absolutely flat in the bending area. Therefore, the film layer(s) formed in the bending area (for example, a signal lead wire formed directly in the bending area, or an insulating layer and a corresponding signal lead wire formed in the bending area, i.e., an insulating layer+signal lead wire), is arranged on the protrusions 10b, thus the film layer(s) also has a corresponding undulating structure. That is, in the bending area, the film layer in contact with the first surface 10a of the flexible basal substrate has an intermeshing structure.

Based on the above, when the flexible display panel is bent in the bending area, compared to the flexible basal substrate having a flat surface in the prior art, the flexible basal substrate provided by the embodiment of the present disclosure has protrusions on the surface in the bending area, a surface of the film layer (including the signal lead wire) covering and in contact with the protrusions also has an undulating structure.

Figure 3:
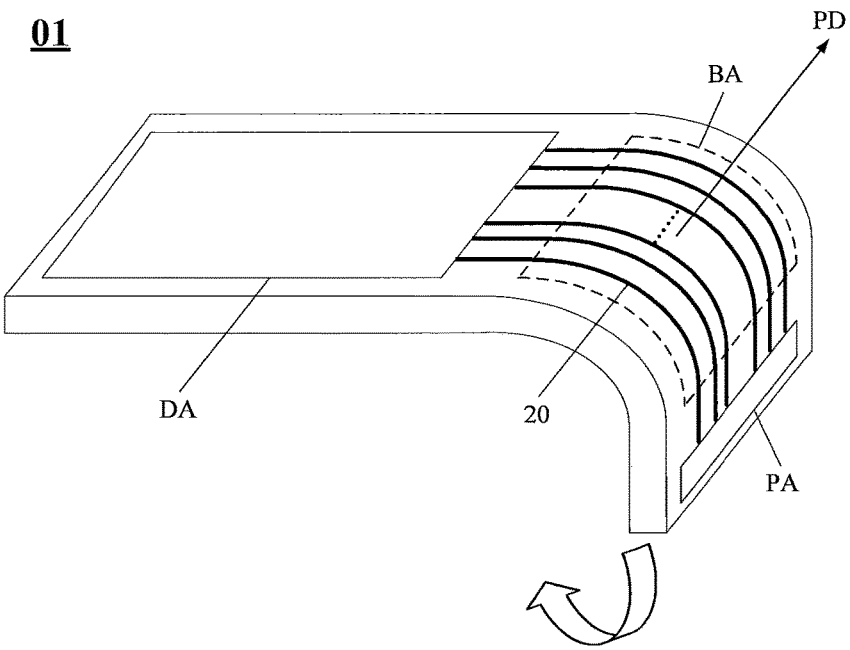
FIG. 3 is a structural schematic diagram of the flexible display panel provided in the embodiment shown in FIG. 1 when being bent.

In this way, as shown in FIG. 3, when the signal lead wire is bent, the portion of the signal lead wire in the bending area receives a stress in a direction perpendicular to the bending surface (indicated with PD in FIG. 3 and the following drawings). This stress can be dispersed in the direction along the bending area, avoiding stress concentration in the direction perpendicular to the bending surface. Therefore, the stress in the direction perpendicular to the bending surface is weakened, which may easily break the signal lead wire. Therefore, it is possible to prevent the signal lead wire from being broken when bent, and to improve the yield after the product is bent. This is more advantageous for the display device including the above flexible display panel to further realize the design of a narrow frame or even a full screen without a frame.

Figure 4:
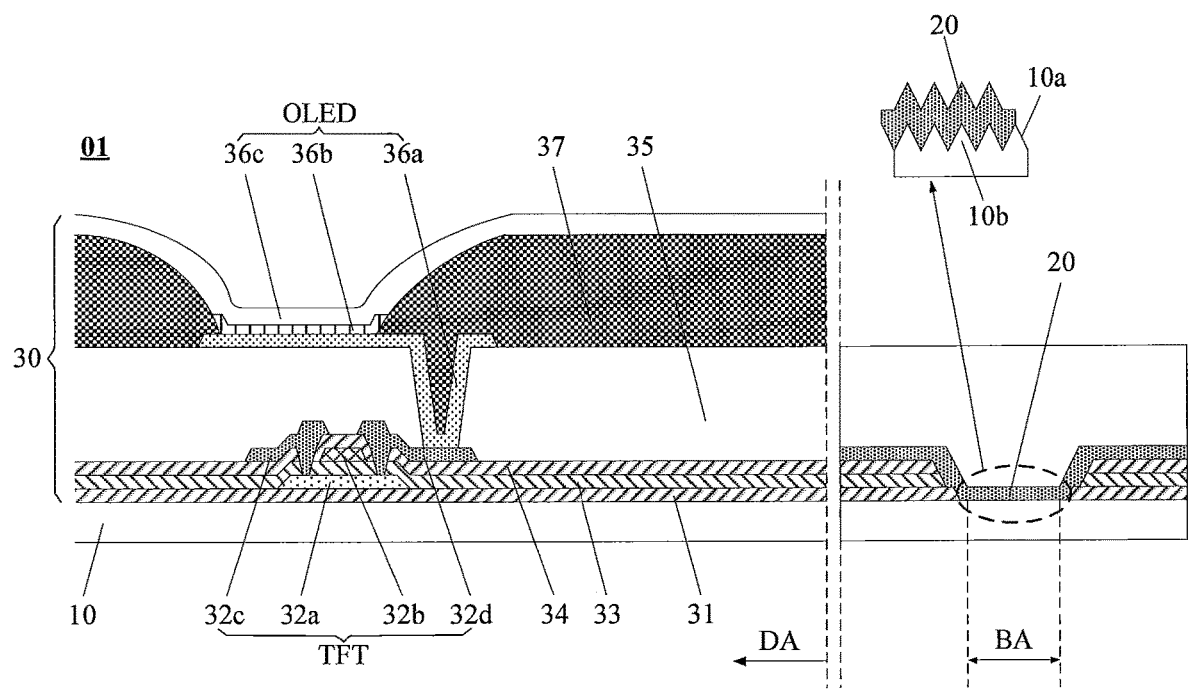
FIG. 4 is a local cross-sectional structural schematic diagram of a flexible display panel according to another embodiment of the present disclosure.

The specific structure of the flexible display panel 01 is further described, as shown in FIGS. 1 and 4, the first surface 10a further includes a display area (indicated with DA in FIG. 1 and the following drawings) and a pad area (indicated with PA in FIG. 1 and the following drawings) for bonding electrodes; the bending area is located between the display area and the pad area.

The flexible display panel 01 further includes: a display structure layer 30 located in the display area and a bonding electrode 40 located in the pad area; the display structure layer 30 includes a signal wire (not shown in FIG. 1). The signal lead wire is electrically connected to the signal wire and the bonding electrode 40.

Here, the specific structure of the display structure layer 30 in the display area may be the structure in the prior art, which is not limited in the embodiment of the present disclosure.

For example, the cross-sectional structure of the display area, the bending area of the flexible display panel and the transition sections on both sides of the bending area can be seen from FIG. 4.

The display structure layer 30 generally includes the following structures provided on the flexible basal substrate 10 (such as a polyimide/PI substrate): a buffer layer 31, an active layer 32a, a gate insulating layer 33, a gate electrode 32b, a gate line (not shown in FIG. 4), an interlayer dielectric layer (ILD) 34, a via hole penetrating the interlayer dielectric layer 34 and the gate insulating layer 33, a source electrode 32c and a drain electrode 32d which are in contact with the active layer 32a through the via hole, a data line connected to the source electrode 32c (not shown in FIG. 4).

The active layer 32a, the gate electrode 32b, the source electrode 32c and the drain electrode 32d constitute a switching device TFT.

The buffer layer 31 may be typically made of an inorganic insulating material such as silicon oxide or silicon nitride to prevent the organic matter in the flexible basal substrate 10 from being affected by the high-temperature process of other subsequent layers, which may cause the organic matter to escape and cause product defects.

Since the OLED device has self-luminescence characteristics, no additional backlight is required, and is more suitable for a flexible display product, the above display structure layer 30 may further include the following structures.

As shown in FIG. 4, the display structure layer 30 further includes a planarization layer (PLN) 35 covering the TFT and an anode 36a disposed on the planarization layer 35. The anode 36a is in contact with the drain electrode 32d of the TFT through the via hole penetrating the planarization layer 35. A pixel defining layer (PDL) 37 exposing the anode 36a is also disposed on the planarization layer 35. A light-emitting function layer 36b and a cathode 36c covering the light-emitting function layer 36b are deposited in a recessed region of the pixel defining layer 37.

The anode 36a, the light-emitting function layer 36b, and the cathode 36c constitute an OLED device.

OLED devices are susceptible to erosion of water and oxygen, affecting the normal illumination. Therefore, the flexible display panel 01 described above may further include a protective layer (not shown in FIG. 4) such as a thin film encapsulation layer (TFE) covering the OLED device.

The embodiment of the present disclosure shown in FIG. 4 is merely an example. The materials and patterns of the respective layers in the display structure layer 30 and the specific structure types of the TFT and the OLED device can refer to the prior art.

Here, as shown in FIG. 1, in the flexible display panel, the bending area and the transition sections connecting the bending area to the display area and the pad area are generally referred to as a pad bending area. The signal lead wire is disposed in this area to electrically connect the signal wire and the bonding electrode.

For example, the signal wire may be a data line, that is, the signal lead wire between the display area and the pad area is not made of a gate line. Instead, the signal lead wire is formed by using the metal layers for the source/drain electrodes and data line.

On the basis of the above, an embodiment of the present disclosure further provides a method for manufacturing the above flexible display panel, and the method may include the following steps: step 101, providing a flexible basal substrate including a first surface; the first surface including a bending area; step 102, patterning the bending area to form a plurality of protrusions; and step 103, disposing a signal lead wire on a side of the first surface facing away from the flexible basal substrate; the signal lead wire extending across the bending area and having a shape substantially matching the plurality of protrusions.

For example, the step of patterning the bending area to form the plurality of protrusions may include: etching the bending area using a mask having a pattern to form the plurality of protrusions in the bending area.

In a direction perpendicular to the first surface of the flexible substrate, a cross-sectional shape of the protrusions is any one of a triangle, a trapezoid, a column, or an inclined column. The shapes of the protrusions may be the same or different, as long as an undulating structure can be formed on the portion of the first surface of the flexible basal substrate in the bending area.

In addition, the number of the protrusions in the bending area should be selectively set according to the size of the flexible display panel, the size of the bending area, and the like, which is not limited in the embodiment of the present disclosure.

It should be noted that the method for manufacturing the flexible display panel may further include the steps of forming the display structure layer in the display area and forming the bonding electrode and the like in the pad area. The specific implementation of each step can refer to the production process of the existing product. All the specific processes including thin film deposition, organic lithography, inorganic film etching, and the like may refer to existing processes. The specific processes in the present disclosure are not limited, and the prior art can be applied.

Two specific embodiments are provided below for describing the above flexible display panel and its manufacturing method in detail.

In some embodiments, it is intended to completely remove the insulating layer between the signal lead wire and the flexible basal substrate in the bending area, so that the signal lead wire 20 is in direct contact with the protrusions on the first surface in the bending area, forming an undulating structure.

Figure 5:
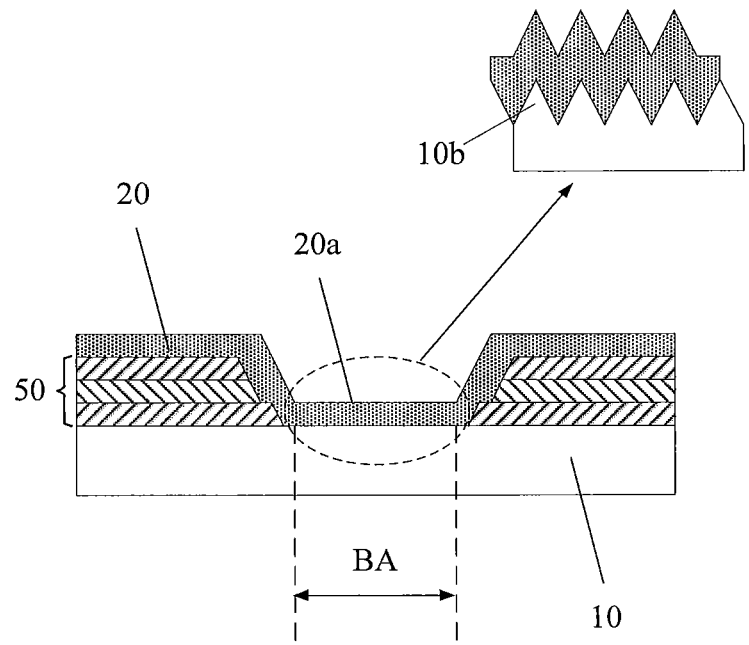
FIG. 5 is a local cross-sectional structural schematic diagram of a flexible display panel according to yet another embodiment of the present disclosure.

As shown in FIG. 5, the signal lead wire 20 is in direct contact with the bending area BA of the first surface 10*a* (as shown in the enlarged portion of the dotted line frame in FIG. 5).

Figure 6:
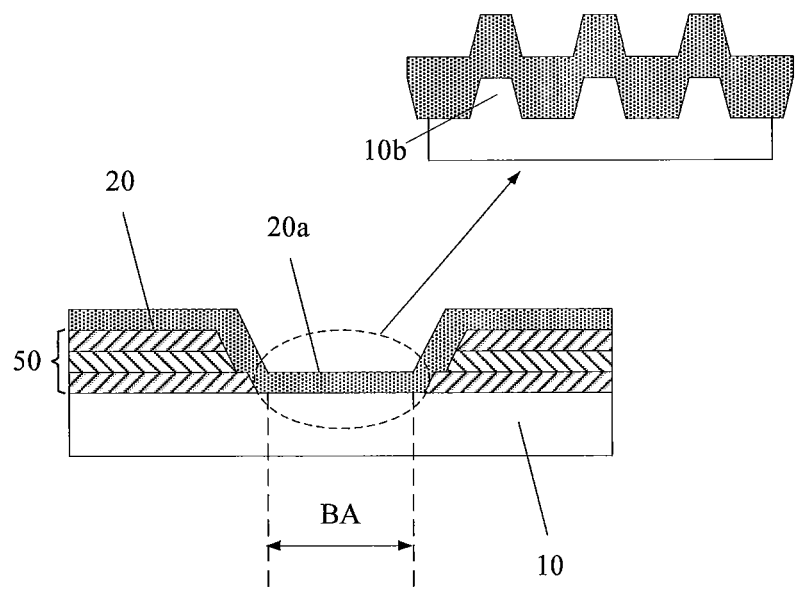
FIG. 6 is a local cross-sectional structural schematic diagram of a flexible display panel according to still another embodiment of the present disclosure.
Figure 7:
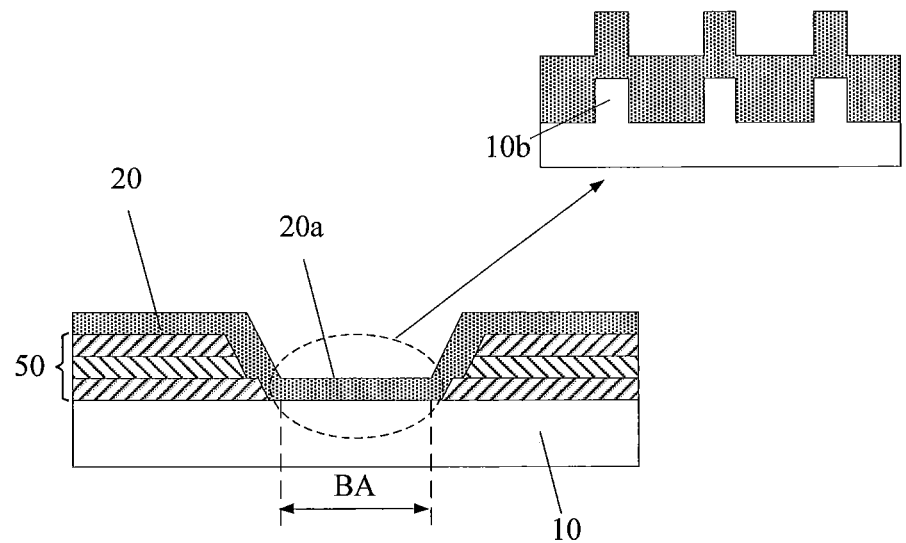
FIG. 7 is a local cross-sectional structural schematic diagram of a flexible display panel according to another embodiment of the present disclosure.
Figure 8:
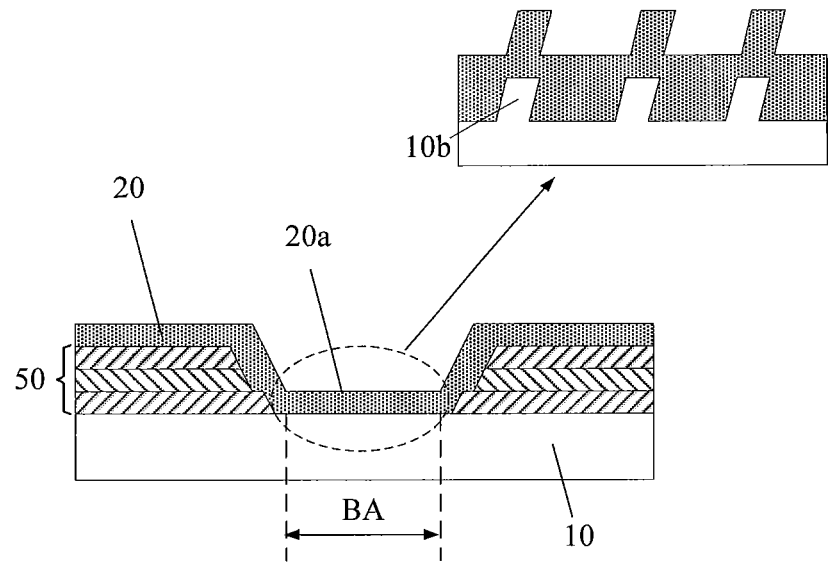
FIG. 8 is a local cross-sectional structural schematic diagram of a flexible display panel according to another embodiment of the present disclosure.

Here, the shape of the protrusion 10*b* in the direction perpendicular to the first surface of the flexible basal substrate is not limited to the triangle shown in FIG. 5 (i.e., the zigzag shape of the first surface of the flexible basal substrate 10 in the bending area). The shape of the protrusion 10*b* may be any one of a trapezoidal shape as shown in FIG. 6, a columnar shape as shown in FIG. 7, and an inclined columnar shape as shown in FIG. 8.

In some embodiments, the flexible display panel further includes a first insulating layer 50 on the first surface and exposing the bending area BA. A portion of the signal lead wire outside the bending area is located on a surface of the first insulating layer 50 facing away from the flexible basal substrate 10. That is, the insulating layer forms a recessed region in the bending area, which is advantageous for bending the bending area of the flexible display panel to the back side.

It should be noted that the first insulating layer 50 may be composed of one or more layers of insulating materials, and the insulating material may be an inorganic insulating material and/or an organic insulating material.

For example, as shown in FIG. 4, the first insulating layer may be specifically formed by a portion of the buffer layer 31, the gate insulating layer 33, and the interlayer dielectric layer 34 extending from the display area.

Figure 9:
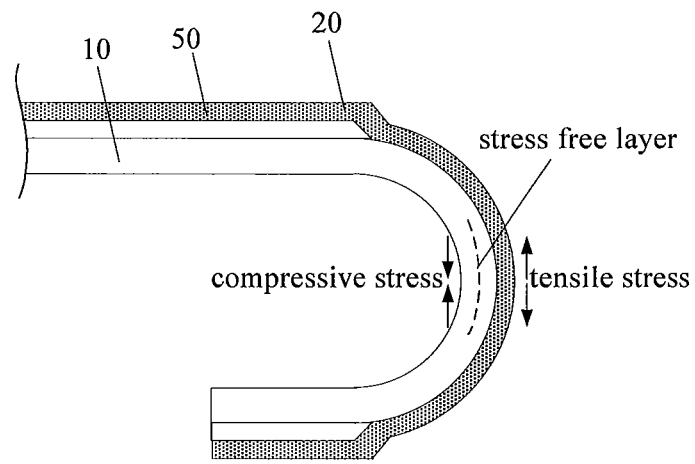
FIG. 9 is a force diagram showing a flexible display panel being bent according to an embodiment of the present disclosure.

Further, as shown in FIG. 9, when the flexible display panel is bent, according to the principle of force and reaction force, the stress applied to the outside portion of the bending area on the flexible basal substrate 10 is tensile stress, the stress applied to the inside portion of the bending area on the flexible basal substrate 10 is compressive stress, and the intermediate portion of the bending area on the flexible basal substrate 10 (indicated with the dotted line in FIG. 9) is a stress free layer.

Since the signal lead wire 20 is in direct contact with the protrusions on the flexible basal substrate 10 in the bending area, forming an undulating structure, the signal lead wire is closer to the position of the stress free layer, thereby reducing the stress applied on the signal lead wire.

Illustratively, the above structure including the plurality of protrusions and the signal lead wire can be prepared by the following process: step 1-1, forming a first insulating layer 50 exposing the bending area BA on the first surface 10*a*; step 2-1, patterning the bending area BA to form a plurality of protrusions 10*b*; step 3-1, disposing a signal lead wire 20 directly on the bending area BA of the first surface 10*a* such that the signal lead wire 20 has a shape substantially matching the plurality of protrusions 10*b*.

It should be noted that, step 1-1 may be specifically implemented by the following manner: after finishing the patterning process (for example, mask process) of the ILD (interlayer dielectric layer) in the pad bending area, the insulating layer in the bending area is completely etched away to expose the portion of the first surface in the bending area.

The patterning process of the above step 2-1 may specifically be: forming a patterned photoresist on the surface of the flexible basal substrate by applying a mask plate, etching the area exposed by the photoresist, thereby forming a plurality of protrusions in the bending area.

In the above step 3-1, a source/drain metal layer may be deposited by magnetron sputtering and etched to form the signal lead wire. After that, an organic protective layer and an insulating layer (for example, a resin) may be formed, and the subsequent steps may refer to the prior art, which is not limited in the embodiment of the present disclosure.

Further, in view of the prior art, some flexible display products have a an inorganic film with a certain thickness (of about 200 to 300 nm) in a bending area, thereby preventing the organic matter in the substrate (such as PI substrate) from escaping during the deposition process and etching process of the signal lead wire, which may cause pollution and product defects.

The inventors have further found in the research that an inorganic film is usually formed by high temperature deposition, the inorganic film has a certain rigidity and is easily broken. When the bending angle of the bending area is equal to or greater than 90°, the inorganic film at the bottom of the bending area is easily broken and tears the signal lead wire above the bending area, causing the signal lead wire to break and causing product defects.

Based on this problem, an embodiment of the present disclosure further provides a solution for retaining an insulating layer in the bending area, the specific structure being as follows.

Figure 10:
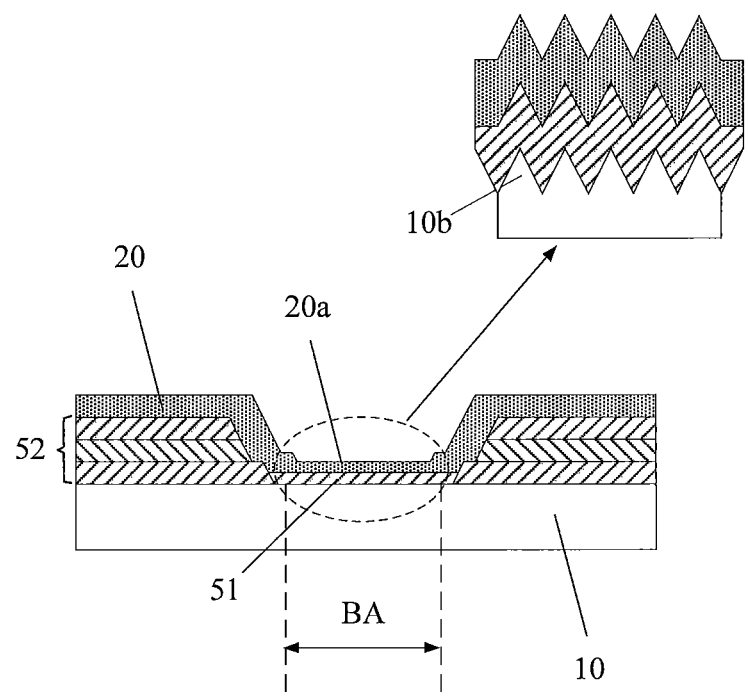
FIG. 10 is a local cross-sectional structural schematic diagram of a flexible display panel according to yet another embodiment of the present disclosure.

As shown in FIG. 10, the flexible display panel further includes a second insulating layer 51 in direct contact with the bending area BA of the first surface 10*a*. A portion of the signal lead wire 20 in the bending area is located on a surface of the second insulating layer 51 facing away from the flexible basal substrate 10 (as shown in the enlarged portion of the dotted line frame in FIG. 10).

Here, the shape of the protrusion 10*b* in the direction perpendicular to the first surface of the flexible basal substrate 10 is not limited to the triangular shape as shown in FIG. 10 (i.e., the zigzag shape of the first surface of the flexible basal substrate 10 in the bending area). The shape of the protrusion 10*b* may be any one of a trapezoidal shape as shown in FIG. 6, a columnar shape as shown in FIG. 7, and an inclined columnar shape as shown in FIG. 8.

In this way, the protrusions of the flexible basal substrate and the second insulating layer directly contacting the protrusions can form an intermeshing structure. On the one hand, the intermeshing structure can decompose the pressure (perpendicular to the direction of the bending surface) applied on the signal lead wire to the horizontal direction when the second insulating layer in the bending area is broken, so as to dissolve the stress perpendicular to the bending surface; on the other hand, the intermeshing structure can enhance the combination of the second insulating layer and the signal lead wire above the second insulating layer, thereby preventing the signal lead wire from being torn when the second insulating layer is broken.

Optionally, the flexible display panel further includes a third insulating layer 52 on the first surface 10*a* and outside the bending area BA. A portion of the signal lead wire 20 outside the bending area BA is located on a surface of, the third insulating layer 52 facing away from the flexible basal substrate 10.

In a direction perpendicular to the first surface of the flexible basal substrate, the thickness of the third insulating layer 52 is greater than the thickness of the second insulating layer 51. That is, a recessed region is formed in the bending area, which is advantageous for bending the bending area of the flexible display panel to the back side.

It should be noted that the second insulating layer 51 may be composed of one or more layers of insulating materials, and the insulating material may be an inorganic insulating material and/or an organic insulating material.

For example, as shown in FIG. 4, the third insulating layer may be specifically formed by a portion of the buffer layer 31, the gate insulating layer 33, and the interlayer dielectric layer 34 extending from the display area.

The height of the protrusions on the flexible basal substrate and the thickness of the second insulating layer directly covered on the protrusions satisfy the following conditions, so that the portion of the signal lead wire on the surface of the second insulating layer can also form a corresponding intermeshing structure, thereby further improving the bonding force between the second insulating layer and the signal lead wire.

Illustratively, the second insulating layer is made of an organic insulating material; in a direction perpendicular to the first surface of the flexible substrate, a height of the plurality of protrusions is in a range of 100 nm to 400 nm, a thickness of the second insulating layer is in a range of 300 nm to 800 nm.

Illustratively, the second insulating layer is made of an inorganic insulating material; in a direction perpendicular to the first surface of the flexible substrate, a height of the plurality of protrusions is in a range of 100 nm to 200 nm, a thickness of the second insulating layer is in a range of 100 nm to 300 nm.

For example, the above structure including the plurality of protrusions, the second insulating layer, and the signal lead wire can be manufactured by a method including the following steps: step 1-2, forming a third insulating layer on the first surface and outside the bending area; step 2-2, patterning the bending area to form a plurality of protrusions; step 3-2, forming a second insulating layer in the bending area and in direct contact with the bending area; and step 4-2, forming a signal lead wire extending across the bending area; wherein a portion of the signal lead wire in the bending area is in direct contact with the second insulating layer, and a portion of the signal lead wire outside the bending area is in direct contact with the third insulating layer.

Optionally, in a direction perpendicular to the first surface of the flexible basal substrate, a thickness of the third insulating layer is larger than a thickness of the second insulating layer.

It should be noted that the second insulating layer may be an organic film or an inorganic film, and protrusions may also be formed on the second insulating layer when the second insulating layer is stacked to the protrusions of the flexible basal substrate.

When it is required to form protrusions on an organic film in the bending area, a mask plate can be used to shield the remaining area except the bending area, and an organic material is coated in the bending area, so as to form the protrusions on the organic film. The thickness of the organic film may be 300 to 800 nm.

When it is required to form protrusions on an inorganic film in the bending area, a mask plate can be used to shield the remaining area except the bending area. The protrusions on the inorganic film can be formed in the bending area by, for example, low temperature plasma enhanced chemical vapor deposition (low temperature PECVD) or atomic layer deposition (ALD), and the thickness of the inorganic film deposited by low temperature PECVD or ALD may be 100 to 300 nm.

The deposition temperature of low temperature PECVD is less than 200° C. to avoid affecting the underlying flexible basal substrate (consisting of organic materials).

The specific material of the inorganic film may be a conventional inorganic insulating material such as silicon nitride, silicon oxynitride or silicon oxide.

After the above steps are finished, an organic protective layer and an insulating layer (e.g., resin) may be formed. The subsequent steps may refer to the prior art, which is not limited in the embodiment of the present disclosure.

Figure 11:
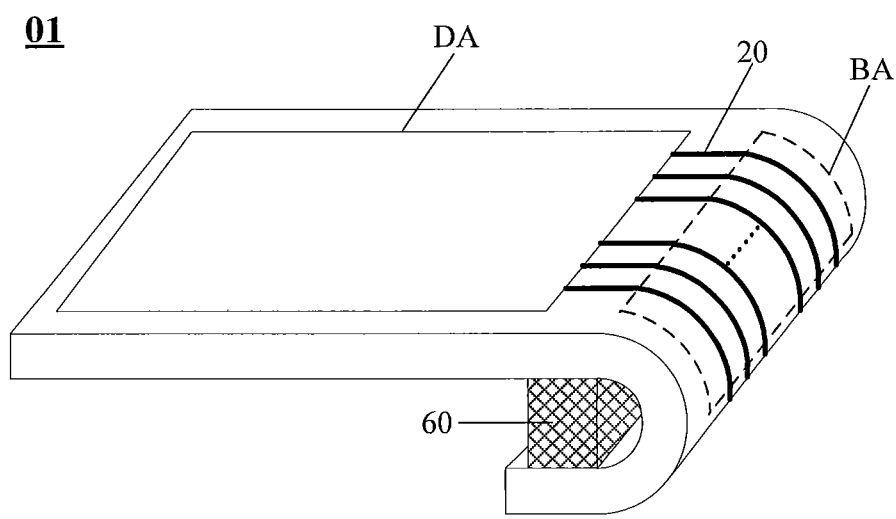
FIG. 11 is a structural schematic diagram of a display device according to an embodiment of the present disclosure.

Further, an embodiment of the present disclosure provides a display device. The display device includes the flexible display panel provided by the above-mentioned embodiments. As shown in FIG. 11, the flexible basal substrate 10 is bent in the bending area BA in a direction away from the signal lead wire 20.

The display device may further include a control chip (not shown in FIG. 11) bound to the bonding electrode in the pad area, and the control chip may be a printed circuit board (PCB).

Further, the bending radius of the flexible display panel 01 is generally larger than the overall thickness of the flexible display panel 01 itself, thus there is a certain space between the pad area and the display area of the flexible basal substrate when the pad area is bent to the back side. Therefore, when the pad area is bent to the back side, the display device may further include a support member 60 disposed between the display area and the binding area of the flexible basal substrate, thereby supporting the substrate on both sides of the bending area.

The material of the support member 60 may be a cushioning organic material such as foam, gel, rubber or the like to improve the impact resistance of the flexible display panel after bending.

According to the flexible display panel, the manufacturing method thereof and the display device provided by the above embodiments of the present disclosure, when the flexible display panel is bent, the stress which is applied on the portion of the signal lead wire located in the bending area and in the direction perpendicular to the bending surface can be reduced. Therefore, it is possible to prevent the signal lead wire from being broken when bent, and to improve the yield after the product is bent. This is more advantageous for the display device including the above flexible display panel to further realize the design of a narrow frame or even a full screen without a frame.

The above embodiments are only used for explanations rather than limitations to the present disclosure, the ordinary skilled person in the related technical field, in the case of not departing from the spirit and scope of the present disclosure, may also make various modifications and variations, therefore, all the equivalent solutions also belong to the scope of the present disclosure, the patent protection scope of the present disclosure should be defined by the claims.

What is claimed is:

1. A flexible display panel, comprising:
   a flexible basal substrate comprising a first surface, the first surface comprising a bending area provided with a plurality of protrusions, the first surface comprising the plurality of protrusions;
   a signal lead wire on a side of the first surface facing away from the flexible basal substrate;
   a second insulating layer in direct contact with the bending area of the first surface; and
   a third insulating layer on the first surface and outside the bending area, wherein the signal lead wire extends across the bending area and has a shape substantially matching the plurality of protrusions, wherein a portion of the signal lead wire in the bending area is on a surface of the second insulating layer facing away from the flexible basal substrate, a portion of the signal lead wire outside the bending area is on a surface of the third insulating layer facing away from the flexible basal substrate, wherein the plurality of protrusions and the second insulating layer form an intermeshing structure, wherein in a direction perpendicular to the first surface of the flexible basal substrate, a thickness of the third insulating layer is larger than a thickness of the second insulating layer, wherein the first surface further comprises a display area and a pad area, and wherein the bending area is between the display area and the pad area.

2. The flexible display panel according to claim 1, wherein the second insulating layer comprises an organic insulating material, and wherein in a direction perpendicular to the first surface of the flexible basal substrate, a height of the plurality of protrusions is in a range of 100 nm to 400 nm, and a thickness of the second insulating layer is in a range of 300 nm to 800 nm.

3. The flexible display panel according to claim 1, wherein in a direction perpendicular to the first surface of the flexible basal substrate, a cross-sectional shape of the protrusions is one of a triangle, a trapezoid, a column, or an inclined column.

4. The flexible display panel according to claim 1,
wherein the flexible display panel further comprises a display structure layer in the display area and a bonding electrode in the pad area, wherein the display structure layer comprises a signal wire, and wherein the signal lead wire is electrically connected to the signal wire and the bonding electrode.

5. A display device comprising the flexible display panel according to claim 1,
wherein the flexible basal substrate is bent in the bending area in a direction away from the signal lead wire.

6. The flexible display panel according to claim 1,
wherein the second insulating layer is made of an inorganic insulating material, and wherein in a direction perpendicular to the first surface of the flexible basal substrate, a height of the plurality of protrusions is in a range of 100 nm to 200 nm, and a thickness of the second insulating layer is in a range of 100 nm to 300 nm.

* * * * *